United States Patent
Sander et al.

(10) Patent No.: US 9,058,961 B2
(45) Date of Patent: Jun. 16, 2015

(54) ROTATABLE SPUTTER TARGET COMPRISING AN END-BLOCK WITH A LIQUID COOLANT SUPPLY SYSTEM

(75) Inventors: Thorsten Sander, Dresden (DE); Cornell Weidelt, Dresden (DE); Hans-Juergen Heinrich, Grossroehrsdorf (DE)

(73) Assignee: VON ARDENNE GmbH, Dresden (DE)

( * ) Notice: Subject to any disclaimer, the term of this patent is extended or adjusted under 35 U.S.C. 154(b) by 608 days.

(21) Appl. No.: 12/436,399

(22) Filed: May 6, 2009

(65) Prior Publication Data

US 2009/0277787 A1    Nov. 12, 2009

(30) Foreign Application Priority Data

May 7, 2008   (DE) .......................... 10 2008 022 690
Aug. 22, 2008 (DE) .......................... 10 2008 039 211

(51) Int. Cl.
*H01J 37/34*  (2006.01)
*C23C 14/34*  (2006.01)

(52) U.S. Cl.
CPC ........... *H01J 37/3435* (2013.01); *H01J 37/342* (2013.01); *C23C 14/3407* (2013.01); *H01J 37/3405* (2013.01); *H01J 37/3497* (2013.01)

(58) Field of Classification Search
CPC .............. H01J 37/3435; H01J 37/3405; H01J 37/3497; H01J 37/342; C23C 14/3407
USPC .............. 204/298.01, 298.21, 298.22, 298.09
See application file for complete search history.

(56) References Cited

U.S. PATENT DOCUMENTS

| | | | | | |
|---|---|---|---|---|---|
| 4,407,713 | A | * | 10/1983 | Zega ......................... | 204/298.22 |
| 4,443,318 | A | * | 4/1984 | McKelvey ............... | 204/298.23 |
| 4,466,877 | A | * | 8/1984 | McKelvey ............... | 204/298.23 |
| 4,519,885 | A | * | 5/1985 | Innis ........................ | 204/192.12 |
| 2003/0173217 | A1 | * | 9/2003 | Crowley ................... | 204/298.22 |
| 2005/0178662 | A1 | * | 8/2005 | Wurczinger ............. | 204/298.21 |
| 2007/0089982 | A1 | * | 4/2007 | Richert et al. ........... | 204/298.01 |

FOREIGN PATENT DOCUMENTS

| | | |
|---|---|---|
| DE | 10213049 A1 | 10/2003 |
| DE | 102006017455 A1 | 10/2007 |
| WO | 2005005682 A1 | 1/2005 |

OTHER PUBLICATIONS

'Seal' definition. Merriam-Webster Online Dictionary [http://www.merriam-webster.com/dictionary/seal?show=0&t=1391810621] [Accessed on Feb. 7, 2014].*

* cited by examiner

*Primary Examiner* — Michael Band
(74) *Attorney, Agent, or Firm* — Heslin Rothenberg Farley & Mesiti P.C.

(57) ABSTRACT

A tube target with an end block for supplying coolant to the tube target is provided. The end block comprises a rotatably mounted carrier shaft for holding and rotating the tube target; a connecting sleeve arranged in the carrier shaft; a sealing element for the tube target on its end facing the end block; a coolant inlet port in the interior of the tube target; and a coolant outlet port. The coolant outlet port is formed by at least one aperture in the sealing element. The aperture is located in the vicinity of the wall of the tube target, and eccentrically to the rotational axis of the tube target.

7 Claims, 2 Drawing Sheets

Figure 1:
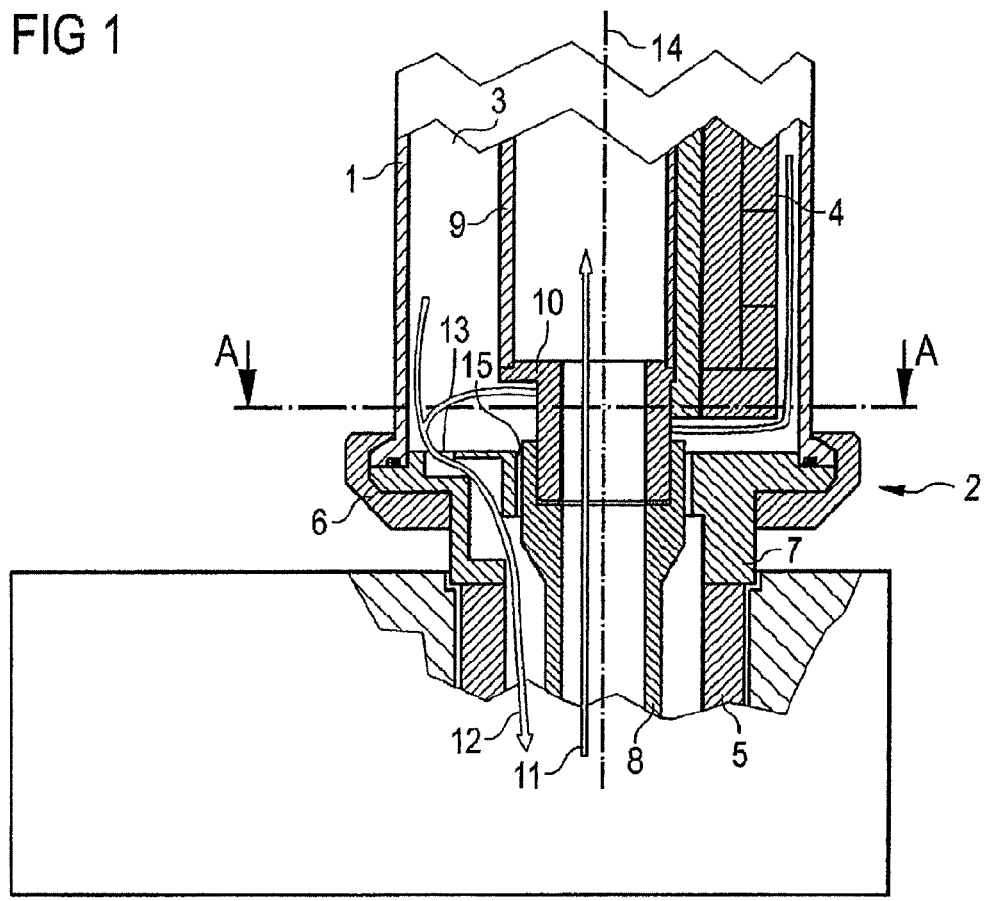

ROTATABLE SPUTTER TARGET COMPRISING AN END-BLOCK WITH A LIQUID COOLANT SUPPLY SYSTEM

CROSS REFERENCE TO RELATED APPLICATIONS

This application claims priority of German application No. 10 2008 022 690.4 filed on May 7, 2008 and German Application No. 10 2008 039 211.1 filed on Aug. 22, 2008, the entire disclosure of these applications being hereby incorporated herein by reference.

The invention relates to a tube target with an end block for supplying coolant to the tube target. In this case the end block comprises a rotatably mounted carrier shaft for holding and rotating the tube target; a connecting sleeve, which is arranged in the carrier shaft; a sealing element for the tube target on its end facing the end block; a coolant inlet port into the interior of the tube target; and a coolant outlet port.

In vacuum coating technology there exist so-called rotating cathodes, where a tubular target usually encloses a magnet system. In this case the tubular target is mounted rotatably and is drivable so that the target material is uniformly eroded. Such a rotating tubular target is typically fastened between two end blocks in the vacuum chamber of a vacuum coating installation. These end blocks are constructed in such a way that each end block makes it possible to mount the tubular target so that it rotates. Said end blocks usually consist of the main components tube target, two end blocks and optionally a magnet system. The tubular target, which comprises a carrier tube with a target material, applied onto the outer surface, or consists totally of a target material, is mounted rotatably in a target clamping device or any other target mounting device. The magnet system, which generates the magnetic field required for plasma focusing, is situated in the interior of the tube target.

The tube target is connected on the front side, for example, by means of a target clamping device, on each side to an end block. The end blocks are designed so as to be multi-functional and have, inter alia, a rotary lead-through for supplying the coolant that is configured for the coolant feed and coolant return.

The German patent DE 102 13 049 A1 describes a tube target, in which the drive and supply are realized by an end block. In this case the tube target consists totally of the material to be sputtered. The target cooling, realized in the interior of the tube target, is fed with a coolant, usually water—if necessary, with additives—by way of an axial coolant inlet port and distributed over a manifold with a plurality of holes in the target interior. The magnet system is mounted in the manifold, which is designed, as an alternative, so as to be rotatable or stationary. The coolant flows out of the target interior by way of numerous apertures, which are configured concentrically about the coolant inlet port in the end block. Under normal, installation-induced horizontal operating conditions of the tube target, a maximal and uniform cooling of the inner wall of the target is desired. However, such a goal is not achieved with the cooling circuit, described in DE 102 13 049 A1, because the coolant does not totally fill the target interior and, thus, does not rest everywhere against the tube.

During the initial filling process of the target interior with the coolant, the air that is located in said interior is pressed by the return out of the target tube, but only to an incomplete extent. In the upper section of the horizontally situated tube there remains an air bubble, which depends on the coolant pressure and the flow rate during the filling process. Since the tube target fills comparatively slowly, the air is, moreover, hardly entrained in the coolant owing to mixing and swirling. Even during the continuous operation of the rotating target, the air bubble in the coolant circuit is neither reduced nor eliminated. The resulting non-uniform cooling may lead to a non-homogeneous erosion of the target material during the course of the coating operation up to the failure of the entire cathode. Similarly during the aeration of the tube target a complete emptying is not possible, because the cooling water cannot flow to the central outlet port.

Furthermore, in DE 10 2006 017 455 A, where the coolant inlet ports and coolant outlet ports are configured eccentrically in the end block, air still remains in the cavity after the respective coolant cavity has been filled, a feature that leads to the above described problems.

BRIEF SUMMARY OF THE INVENTION

Therefore, the object of the invention is to provide a rotating tube target, with which the inflow and the outflow of coolant into the tube target and, hence, its cooling can be improved.

The design of the end block of the tube target allows the air, located in the interior of the tube target, to be forced almost completely through the eccentric aperture in an end face of the tubular target, which is formed by a sealing element, so that no air bubble remains in the tube target either during the continuous coolant circulation or during the filling process of the tube target with a coolant. Insofar as a magnet system is disposed in the tube target, optimal cooling for the magnet system is also guaranteed, even for the case that owing to the process said magnet system is located in the upper segment of the horizontally arranged tube target. Similarly total aeration of the tube target is also possible—for example, during its exchange.

The eccentric design of the aperture realizes in connection with the rotation of the tube target during normal operation in each revolution the outflow of the coolant as long as the aperture is located below the coolant level and realizes the escape of any air, when the aperture is located in the region of the air bubble, generated with the coolant outflow, or at least when it is located at the uppermost reversal point.

BRIEF DESCRIPTION OF THE DRAWING FIGURES

Figure 2:
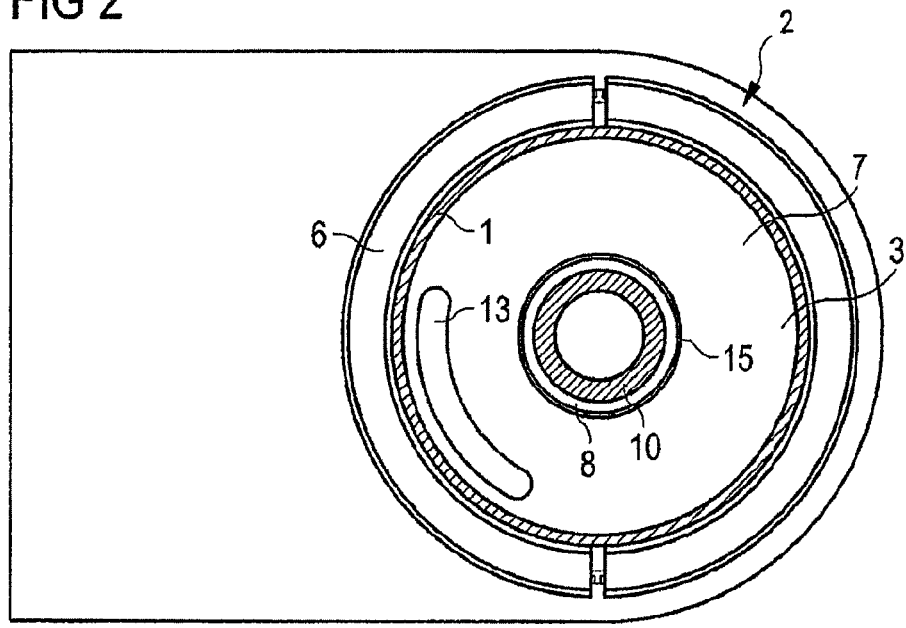
Figure 2A:
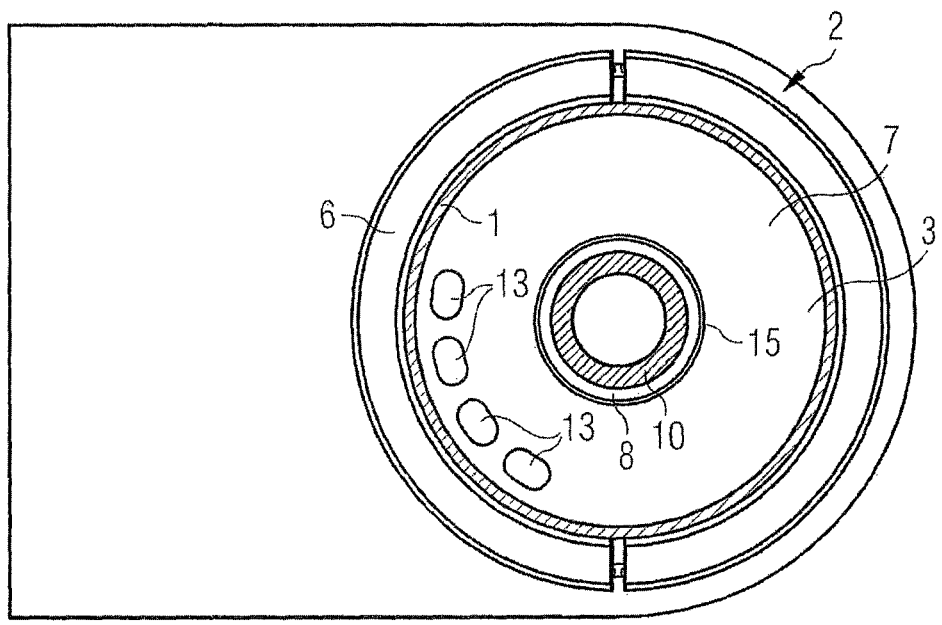

The invention shall be explained in detail below with reference to one embodiment. In the related drawings FIG. 1 is a detail of a tube target with the end block serving to supply the coolant;

FIG. 2 is a sectional view of the tube target with a single eccentric aperture, along the intersection A-A in FIG. 1; and FIG. 2A is a sectional view of a tube target with an eccentric arrangement of multiple apertures.

DETAILED DESCRIPTION

The tube target 1 of a sputtering cathode usually comprises the tubular target, which is held on both sides in an end block 2. The supply with the coolant and the drive for rotating the tube target as well as the power supply of the cathode are realized by means of the end blocks 2. FIG. 1 shows only that portion of the tube target 1 with that end block 2, by means of which the coolant is fed. Usually the same end block 2 also supplies the power (not shown), and the drive ensues by means of the second end block (not illustrated), which also exhibits a rotatable mounting. Other functional embodiments of the end blocks are also possible. For example, there exist tube targets, with which the above described functions are implemented by means of only one of the end blocks. The tube target 1, shown in FIG. 1, is operated as a magnetron cathode for magnetron sputtering and, therefore, encloses a magnet system 4 in its interior 3. The magnet system is process-dependent and is not necessary for the coolant circuit of the tube target that is described below.

The end block 2 of the tube target 1, which serves to supply the coolant, comprises a rotatably mounted carrier shaft 5, which is connected to the tube target 1 on the front side by means of a suitable holder—for example, by means of a target clamping device 6. The tube target 1 is mounted in a rotatable manner by means of the carrier shaft 5. The tube target 1 is sealed in the direction of the carrier shaft 5 by means of a sealing element 7. The connection between the sealing element 7 and the tube target 1 is designed so as to be tight, so that the sealing element 7 rotates along with the tube target 1.

The carrier shaft 5, which is designed as a hollow shaft, has a connecting sleeve 8. This connecting sleeve 8 holds a tubular coolant manifold 9, which is disposed in the tube target 1 and is connected sealingly with a connection 10 to the connecting sleeve 8 by means of the sealing element 7. Both the connecting sleeve 8 and the connection 10 are designed so as to be tubular and form the coolant inlet port 11 into the coolant manifold 9. The coolant manifold 9 exhibits one aperture or a plurality of apertures (FIG. 2A), so that the coolant, entering into the coolant manifold 9, is distributed over the entire length and in the entire surrounding interior 3 of the tube target 1. In the illustrated embodiment the coolant manifold 9 is open on the other end (not illustrated), which terminates at a short distance upstream of the second end block and seals the tube target 1 on this end. The coolant manifold 9 serves simultaneously as a holder of a magnet system 4. This magnet system is located stationarily in the lower region of the horizontally arranged tube target 1.

The coolant outlet port 12 from the interior 3 of the tube target 1 is realized by an aperture 13 in the sealing element 7. This aperture 13 is configured eccentrically in relation to the rotational axis of the tube target 1 and close to the wall of the tube target 1. In the embodiment the minimum distance between the aperture 13 and the wall of the tube target 1 is defined by the target clamping device 6. In a different design of the target holder an additional reduction in the distance is possible, so that the hazard of a remaining cavity, which is not filled with coolant, can be further minimized.

FIG. 2 shows that the aperture 13 in the embodiment has the shape of a slot, which describes an arc over an angle of approximately 90°. The length of the arc and the width of the slot are dimensioned in such a way that the size of the aperture 13 corresponds approximately to the cross section of the coolant inlet port 11. In this context it is possible for the size ratios to vary to such an extent that the coolant can circulate without any obstruction. Similarly other shapes of the aperture 13 or the division of the aperture 13 into a plurality of individual apertures (FIG. 2A) is/are possible. The rotatable sealing element 7 exhibits in the direction of the stationary connecting sleeve 8 an annular gap 15, which is selected so small that it is possible for the sealing element 7 to rotate, but no coolant can issue from the annular gap 15. Should, nevertheless, small amounts of coolant issue through the annular gap 15, this is harmless, since the annular gap empties into the coolant outlet port 12. As an alternative, for example, in an additional design of the coolant outlet port 12, it is possible for the sealing element 7 and the connecting sleeve 8 to be connected so as to be sealed and rotatable relative to each other.

During normal operation of the tube target 1 the sealing element 7 and the aperture 13 rotate along with the tube target 1, so that the aperture 13 travels periodically past the uppermost reversal point of its orbital motion and, thus, the air can also flow out of this region of the tube target 1. In the remaining region of the circular path of the aperture 13 the coolant can drain in order to realize the coolant circuit. In this case the shape of the aperture as an arc facilitates the outflow of air and coolant during the rotational motion. In addition, the partial turbulence of the coolant in the tube target 1 as a consequence of its rotation allows the coolant to be forced to drain in its entirety or at least almost totally. In this way the filling of the tube target 1 with coolant or the emptying of the tube target can take place. Owing to the continuous rotation of the tube target 1 and, thus, owing to the revolving eccentric aperture 13, the air bubble is forced in succession out of the tube target during the filling process, and during the emptying process the goal of draining all of the coolant is achieved.

The invention claimed is:

1. Tube target with an end block for supplying coolant to the tube target, the end block comprising a rotatably mounted hollow carrier shaft extending along a central longitudinal axis for holding and rotating the tube target about the central longitudinal axis; a stationary connecting sleeve arranged concentrically in the carrier shaft with an axially extending intermediate passageway provided between the rotatably mounted hollow carrier shaft and the stationary connecting sleeve; and a sealing element for the tube target on an end of the tube target facing the end block; the sealing element extending laterally inward from the tube target to adjacent the stationary connecting sleeve and being connected sealingly to the tube target and mounted rotatably on the stationary connecting sleeve to rotate with the tube target relative to the stationary connecting sleeve, and the stationary connecting sleeve comprising a coolant inlet port for flowing coolant into a coolant manifold within the tube target, wherein for coolant outflow, an arrangement of one or more apertures is provided in the sealing element, the one or more apertures being in fluid communication with the intermediate passageway to form a coolant outlet port, the arrangement being located adjacent to a cylindrical wall of the tube target, eccentrically to the central longitudinal axis that serves as a rotational axis of the tube target, and closer to the cylindrical wall of the tube target than to the stationary connecting sleeve, wherein, during rotation of the tube target and sealing element, the arrangement rotates along with the tube target and provides, in each revolution of the tube target, outflow of the coolant through the coolant outlet port when the arrangement is below a level of the coolant, and escape of air at least when the arrangement is located at an uppermost position, wherein an annular gap between the sealing element and the stationary connecting sleeve facilitates rotatable mounting of the sealing element on the stationary connecting sleeve, the annular gap is sized to rotate the sealing element while having no coolant issue from the annular gap, and the annular gap connecting a space between the tube target and the coolant manifold with the intermediate passageway of the coolant outlet port.

2. Tube target, as claimed in claim 1, wherein the arrangement is located in only one circular segment of the sealing element.

3. Tube target, as claimed in claim 1, wherein size of all apertures of the arrangement together corresponds approximately to size of the coolant inlet port.

4. Tube target, as claimed in claim 1, wherein the coolant inlet port empties into the coolant manifold disposed in the tube target, the coolant manifold distributing the coolant over an entire length of the tube target.

5. The tube target as claimed in claim 1, wherein the arrangement comprises an arc shaped slot.

6. The tube target as claimed in claim 5, wherein said arc shaped slot extends over an angle of approximately 90 degrees.

7. The tube target as claimed in claim 5, wherein the arc shaped slot is divided into a plurality of individual apertures.

\* \* \* \* \*